United States Patent [19]

Mowry

[11] Patent Number: 5,065,094
[45] Date of Patent: Nov. 12, 1991

[54] TWO TERMINAL MAGNETORESISTIVE SENSOR HAVING DC BLOCKING CAPACITOR

[75] Inventor: Gregory S. Mowry, Burnsville, Minn.

[73] Assignee: Seagate Technology, Inc., Scotts Valley, Calif.

[21] Appl. No.: 563,990

[22] Filed: Aug. 7, 1990

[51] Int. Cl.⁵ .................... G01R 33/06; G11B 5/127; G11B 5/33
[52] U.S. Cl. ............................ 324/207.21; 324/235; 324/252; 360/113; 338/32 R
[58] Field of Search .................. 324/207.21, 235, 252, 324/260, 262; 338/32 R, 32 H; 360/113; 307/309

[56] References Cited

U.S. PATENT DOCUMENTS

| | | | |
|---|---|---|---|
| 3,370,227 | 2/1968 | Bader | 324/54 |
| 4,052,748 | 10/1977 | Kuijk | 324/252 X |
| 4,142,218 | 2/1979 | Gorter | 360/113 |
| 4,190,871 | 2/1980 | Walraven | 360/113 |
| 4,255,708 | 3/1981 | Wilson, III | 324/207.21 |
| 4,280,158 | 7/1981 | de Niet | 360/113 |
| 4,393,427 | 7/1983 | Sakurai | 360/112 |
| 4,492,997 | 1/1985 | Arai et al. | 360/113 |
| 4,535,375 | 8/1985 | Mowry et al. | 360/113 |
| 4,556,925 | 12/1985 | Suenaga et al. | 324/252 X |
| 4,566,050 | 1/1986 | Beam et al. | 324/252 X |
| 4,580,175 | 4/1986 | Mowry et al. | 360/113 |
| 4,660,113 | 4/1987 | Nomura et al. | 360/113 |
| 4,673,998 | 6/1987 | Souda et al. | 360/113 |
| 4,677,512 | 6/1987 | Akiyama et al. | 360/110 |
| 4,712,144 | 12/1987 | Klaassen | 360/67 |
| 4,727,323 | 2/1988 | Zabler | 324/252 |
| 4,821,133 | 4/1989 | Mowry et al. | 360/113 |
| 4,841,398 | 6/1989 | Mowry | 360/113 |
| 4,843,506 | 6/1989 | Gill et al. | 360/113 |

FOREIGN PATENT DOCUMENTS

| | | | |
|---|---|---|---|
| 0042136 | 12/1971 | Japan | 324/207.21 |
| 0068266 | 6/1979 | Japan | 324/207.21 |

Primary Examiner—Kenneth A. Wieder
Assistant Examiner—Warren S. Edmonds
Attorney, Agent, or Firm—Kinney & Lange

[57] ABSTRACT

A magnetoresistive sensor requires only two electrical connections to operate. The magnetoresistive sensor uses a hammerhead design and a barber pole array. Blocking capacitors are used to define two signal paths, one for a DC sense current, and one for an AC data signal. The blocking capacitors provide an electrical short to AC signals across wing regions of the magnetoresistive sensor. The blocking capacitors are fabricated directly upon a wafer which carries the magnetoresistive sensor.

21 Claims, 5 Drawing Sheets

TWO TERMINAL MAGNETORESISTIVE SENSOR HAVING DC BLOCKING CAPACITOR

BACKGROUND OF THE INVENTION

The present invention relates to magnetoresistive sensors. In particular, the present invention relates to a magnetoresistive sensor having fewer than four terminals.

Magnetoresistive sensors are used in magnetic storage systems to detect magnetically encoded information. A changing magnetic field modulates the resistivity of the magnetoresistive sensor. The resulting change in resistance is detected by passing a sense current through the magnetoresistive sensor and measuring the voltage drop across the magnetoresistive sensor. The resulting voltage signal can be used to recover information from a magnetic storage medium such as a magnetic disk.

Practical magnetoresistive sensors are typically formed using ferromagnetic metal alloys, for example, nickel iron ($Ni_{80}Fe_{20}$). The nickel iron alloy is deposited in a thin film upon a substrate or wafer. Changing magnetic fields in a magnetic storage medium produce changes in the magnetization of the magnetoresistive sensor and thereby change the resistance of the sensor.

As many as four electrical connections to the magnetoresistive sensor are needed to use the head readback stored information. Two connections are used to supply electrical current through the sensor, and two other connections are used to detect changes in voltage across an active region of the head due to the change in resistance associated with the presence of a magnetic field near the magnetoresistive sensor. Detection circuitry is connected to the magnetoresistive sensor so that the changing resistance of the magnetoresistive sensor can be monitored to produce an output which is representative of information stored on the magnetic storage medium.

The overriding goal of all magnetoresistive sensor designs is to develop a device which is free from Barkhausen noise. This is achieved using the "hammerhead" design described in U.S. Pat. No. 4,535,375 issued Aug. 13, 1985 to Mowry et al entitled "Magnetoresistive Head" which is incorporated by reference. The magnetoresistive head of the Mowry et al patent uses a tapped "barber pole" array.

The barber pole array develops a longitudinal magnetic field to stabilize a central single domain region and thereby eliminate the possibility of signal degradation due to Barkhausen noise. This structure provides reproducible, stable magnetoresistive sensors. Four electrical connections are needed to operate the "Hammerhead" magnetoresistive sensor. Additionally, an integrated inductive write/magnetoresistive read head requires at least two additional leads for a write coil. Therefore, an integrated inductive write/magnetoresistive read head using the hammerhead design requires a minimum of six electrical connections.

A magnetoresistive head which requires fewer connections to the magnetoresistive element, while maintaining the single domain integrity of the sensor, would improve reliability, decrease manufacturing costs and be a significant contribution to the art of magnetoresistive heads.

SUMMARY OF THE INVENTION

The present invention provides a magnetoresistive sensor designed to eliminate Barkhausen noise by stabilizing a single domain magnetization state in the active region of the magnetoresistive element and which uses only two electrical connection to the magnetoresistive element.

The present invention provides a magnetoresistive sensor needing only two electrical connections without sacrifice of the stability or reproducibility in the magnetic domain pattern of the magnetoresistive sensor. In the present invention, a sense current is provided to terminals on ends of the magnetoresistive sensor. Voltage sense terminals are connected to an active region of the magnetoresistive element. The voltage sense terminals are located between the end terminals. Blocking or isolation capacitors are provided between the end terminals and the voltage sense terminals which are positioned between the end terminals. In the present invention, adjacent tracks which underlie wing regions of the extended magnetoresistive sensor will not contribute a coherent noise signal to the on-track signal which would render the configuration useless. The isolation capacitors allow the sense current to be applied throughout the entire barber pole array so that the stabilizing effect of the barber pole array is not lost. In the present invention, off-track performance is provided along with a highly stable design.

Using isolation capacitors in accordance with the present invention, a DC sense current is applied throughout the entire length of the barber pole array. Furthermore, the capacitors do not alter the longitudinal stability field generated by the barber pole array. A data signal from magnetically stored information, however, is an AC signal which is not blocked by the isolation capacitors. Thus, the terminals of a magnetoresistive sensor made in accordance with the present invention, carry both a DC sense current and an AC data signal. A larger valued capacitor provides smaller attenuation to the AC data signal. The present invention provides the benefits of a four terminal magnetoresistive sensor design and uses only a pair of terminals.

DETAILED DESCRIPTION OF THE PREFERRED EMBODIMENTS

Figure 1:
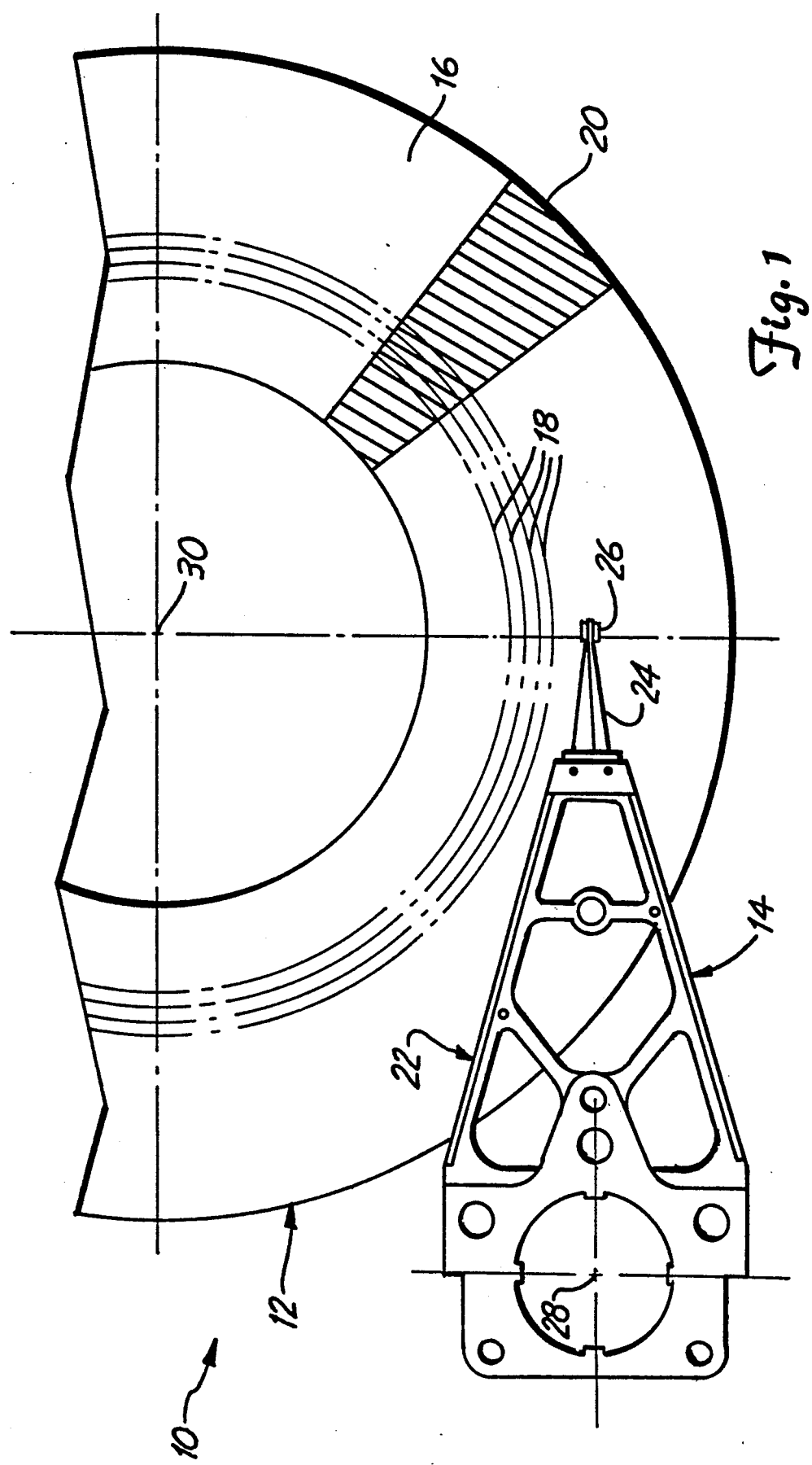
FIG. 1 is a top plan view of a support arm and a magnetic storage disk.

FIG. 1 is a top plan view of a magnetic storage system 10. Magnetic storage system 10 includes magnetic storage disk 12 and arm 14.

Magnetic storage disk 12 includes a surface 16 divided into data tracks 18 and data sectors 20. Data tracks 18 extend radially around disk surface 16 and data sectors 20 extend axially from a center of rotation 30 of magnetic storage disk 12.

Arm 14 includes support arm 22 and flexure arm 24. Flexure 24 carries a slider 26 at its distal end. Slider 26 carries a magnetoresistive sensor (not shown in FIG. 1).

Arm 14 rotates about axis of rotation 28 so that slider 26 moves radially across the surface of disk 12. Magnetic disk 12 rotates about an axis of rotation 30. As magnetic disk 12 rotates, the slider 26 "flies" slightly above the surface 16 of magnetic disk 12. By rotating arm 14 about axis of rotation 28, slider 26 moves between adjacent tracks 18 above disk surface 16.

Figure 2:
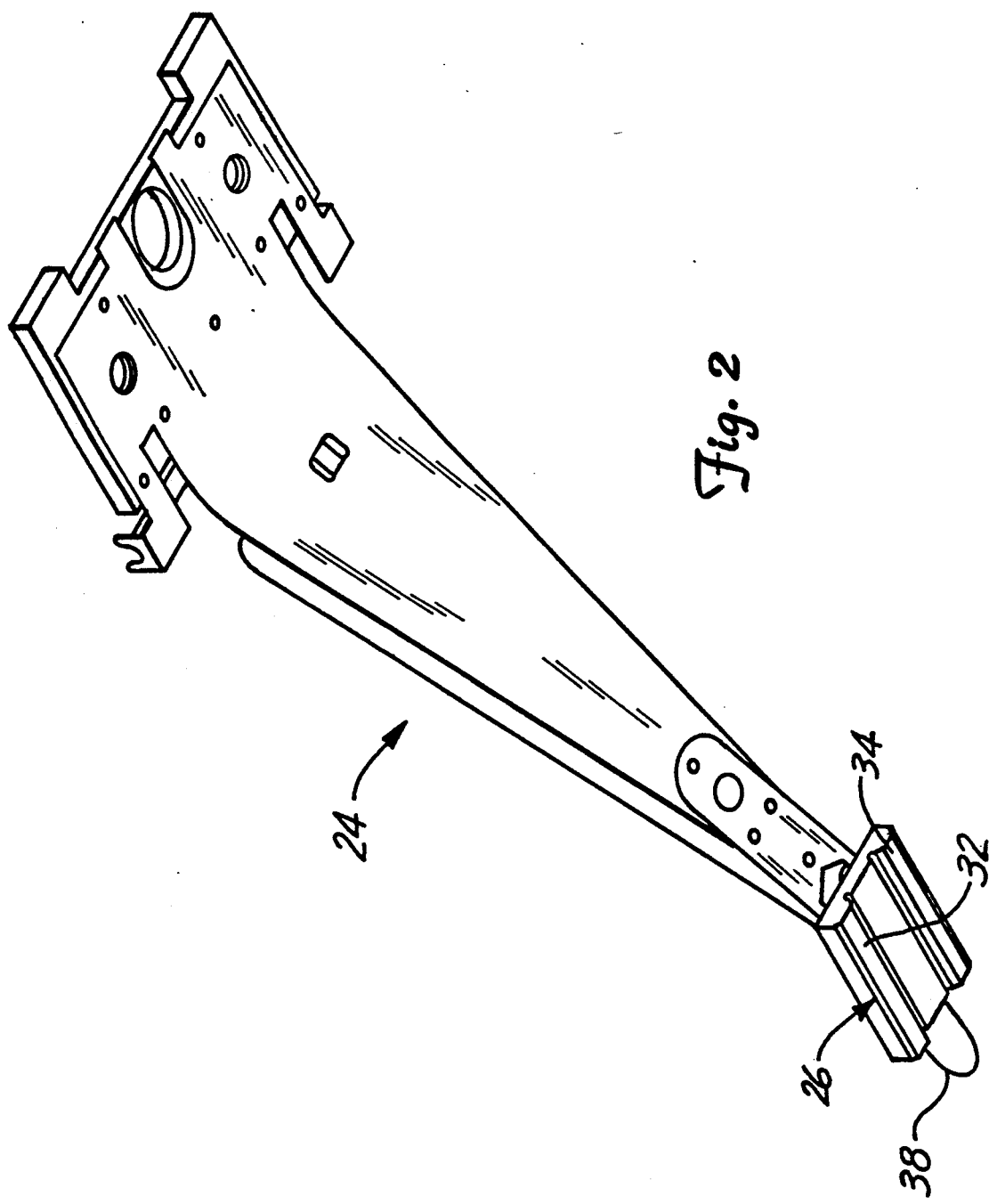
FIG. 2 is a perspective view of a flexure arm and slider.

FIG. 2 is a perspective view of flexure arm 24 and slider 26. Slider 26 includes rails 32 and 34. Rails 32 and 34 contribute to the aerodynamic properties of slider 26. Slider 26 also carries magnetoresistive sensors 36 (see FIG. 3) in accordance with the present invention. Magnetoresistive heads 36 connect to electrical conductors 38.

Figure 4:
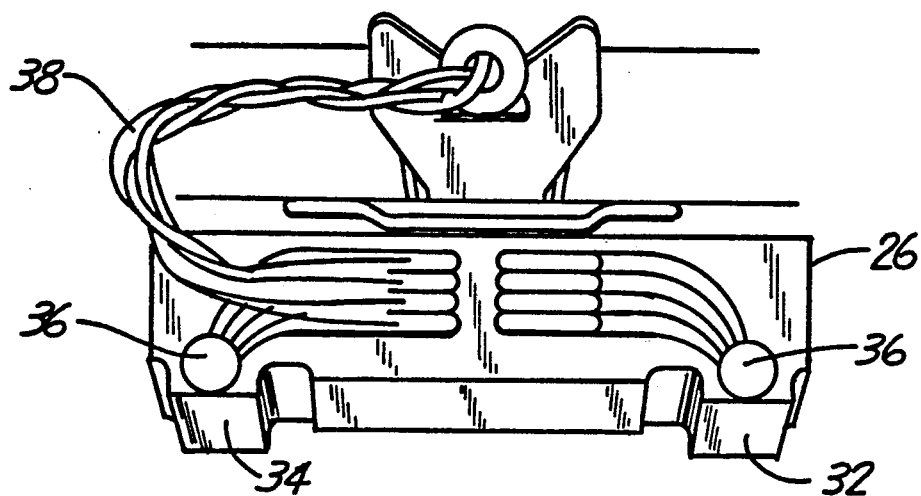
FIG. 4 is a perspective view of magnetoresistive heads mounted on the slider of FIG. 3.
Figure 3:
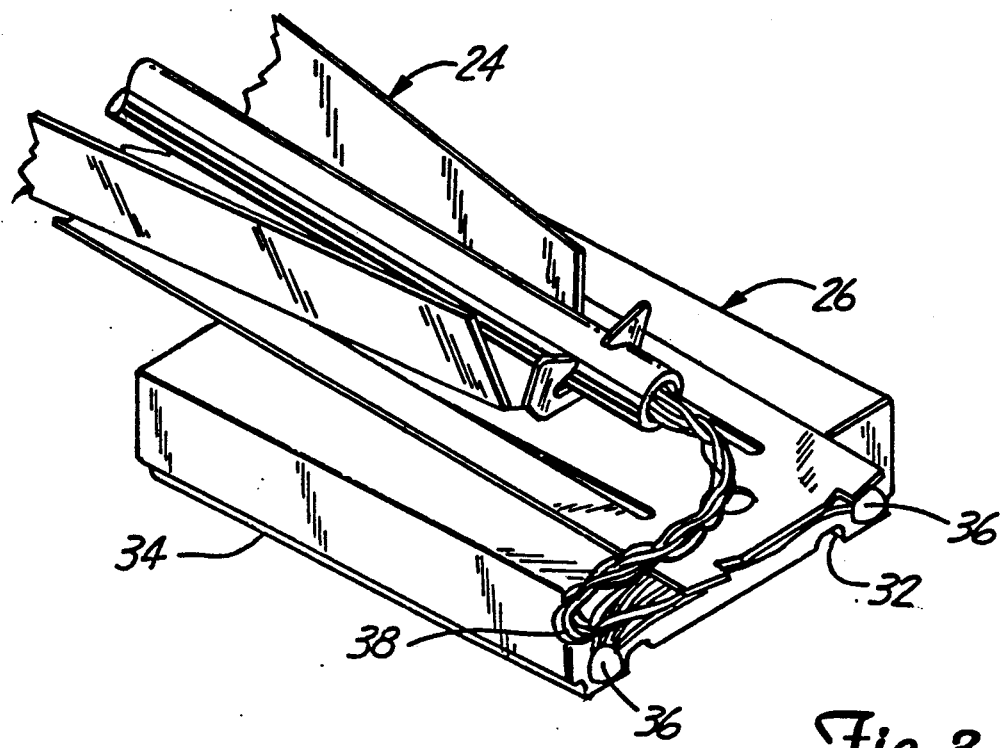
FIG. 3 is a perspective view of a slider.

FIGS. 3 and 4 are perspective views of slider 26. Magnetoresistive heads 36 include four electrical connections in accordance with the present invention. Two of the electrical connections are used for a write coil and two of the electrical connections are used for readback of magnetically stored information in accordance with the present invention.

Figure 5:
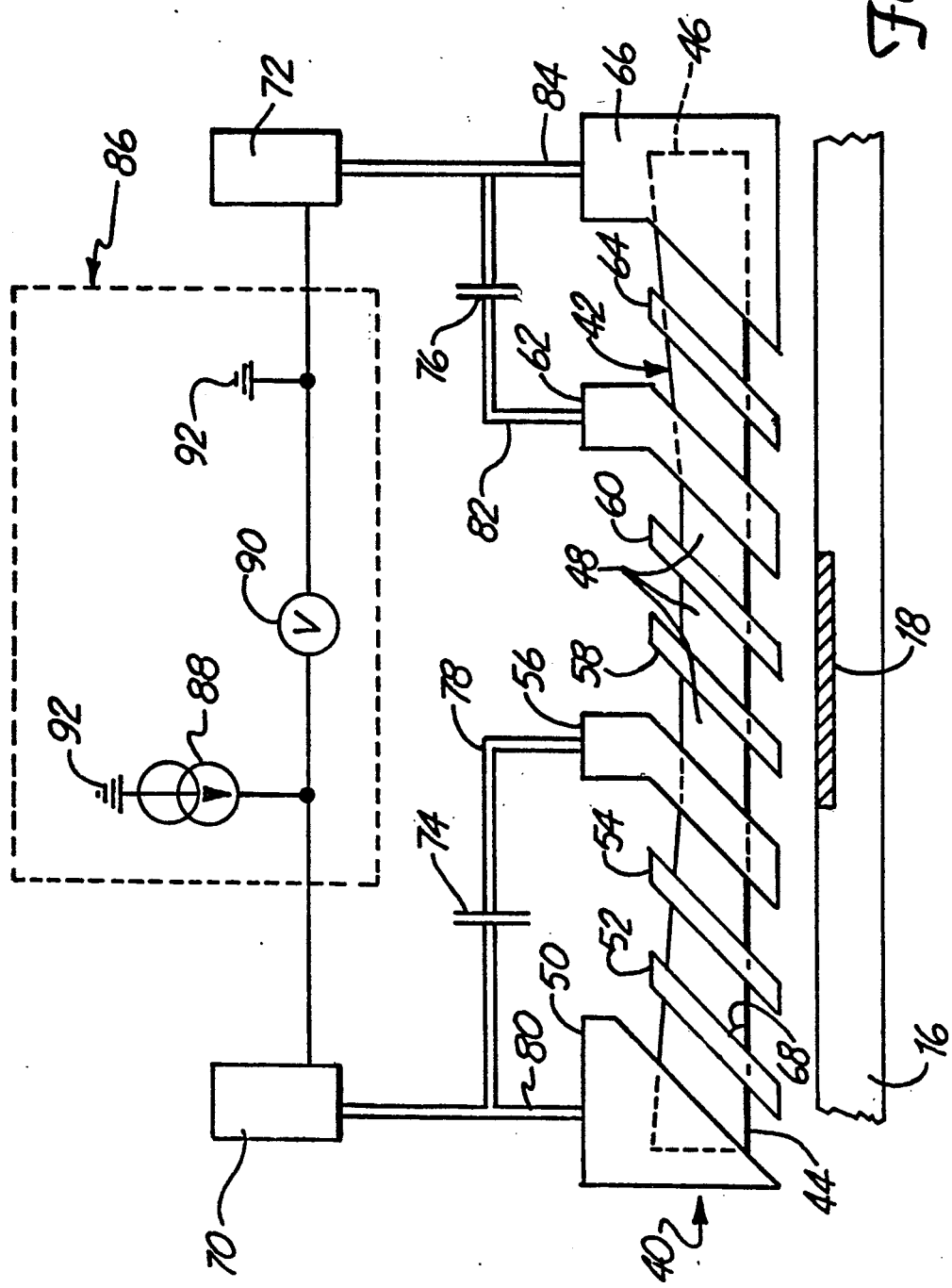
FIG. 5 shows a first embodiment of a magnetoresistive head made in accordance with the present invention.

FIG. 5 shows a magnetoresistive sensor 40 which comprises a portion of magnetoresistive head 36. Magnetoresistive sensor 40 includes magnetoresistive element 42. Magnetoresistive sensor 40 is shown relative to data track 18 of magnetic disk surface 16. Magnetoresistive element 42 includes a first end 44, a second end 46 and a central, active region 48. Equipotential strips 50, 52, 54, 56, 58, 60, 62, 64 and 66 are positioned along the length of magnetoresistive element 42. Strips 50, 52, 54, 56, 58, 60, 62, 64 and 66 are positioned at an angle (for example, angle 68) with respect to magnetoresistive element 42. Magnetoresistive sensor 40 includes terminals 70 and 72 and capacitors 74 and 76. Capacitor 74 is connected to equipotential element 56 through electrical conductor 78, and equipotential strip 50 through electrical conductor 80. Capacitor 76 is connected to equipotential element 62 through electrical conductor 82 and equipotential element 66 through electrical conductor 84. Terminals 70 and 72 are connected to equipotential elements 50 and 66, respectively.

Data sense circuitry 86 connects to terminals 70 and 72 of magnetoresistive sensor 40. Data sense circuitry 86 include a current source 88 and a voltage sensor 90. Current source 88 is electrically connected between terminal 70 and an electrical ground 92. Voltage sensor 90 is electrically connected to terminal 70 and terminal 72 and electrical ground 92. Voltage sensor 90 is connected to measure the voltage difference between terminals 70 and 72 of magnetoresistive sensor 40.

Current source 88 drives current through magnetoresistive element 42 from equipotential element 50 toward equipotential element 66. This current will leave and enter each equipotential element 50-52, 54, 56, 58, 60, 62, 64 and 66 in a direction normal to the edge of the element.

Blocking capacitors 74 and 76 block DC current from current source 88. Thus, DC current enters magnetoresistive sensor 40 through element 50 and exits magnetoresistive sensor 40 through element 66. Data track 18 carries magnetically encoded information. This information sets up a magnetic field in central (active) region 48 of magnetoresistive sensor 40. As magnetoresistive sensor 40 moves across magnetic surface 16, the magnetic field through central region 48 changes. The changing magnetic field alters the resistance of central region 48 of magnetoresistive sensor 40, which changes the voltage drop across active element 48. This causes a changing voltage drop between equipotential strip 56 and equipotential strip 62. The changing voltage drop sets up an AC signal between strips 56 and 62. Blocking capacitors 74 and 76 block the DC sense current provided by current source 88 but allow the AC data signal from strips 56 and 62 to pass. Voltage sensor 90 connected between terminals 70 and 72 detects the AC data signal between strips 56 and 62. This data signal is representative of magnetically encoded information recorded upon data track 18 of magnetic disk surface 16.

In the preferred embodiment of the present invention shown in FIG. 5, blocking capacitors 74 and 76 are manufactured directly upon a wafer which carries magnetoresistive 40. Electrical conductors 78, 80, 82 and 84 are also fabricated directly upon the wafer. The terminals 70 and 72 provide bonding pads to allow connection to magnetoresistive sensor 40. The present invention allows sense current from current source 88 to pass through the entire barber pole of magnetoresistive sensor 40 to achieve maximum benefits provided by the "hammerhead" structure to eliminate Barkhausen noise. Blocking capacitors 74 and 76 reduce the active region in which magnetically encoded data is sensed, so that spurious signals picked up by the "wings" (the two areas on each side of active region 48) do not contribute to the AC voltage signal sensed by voltage sense element 90. Signals picked up by the wing portions of magnetoresistive sensor 40 cause resistance variations between strip 50 and 56, or strip 62 and 66. However, any AC signals generated due to these resistance variations are electrically shorted by blocking capacitors 74 and 76.

Figure 6:
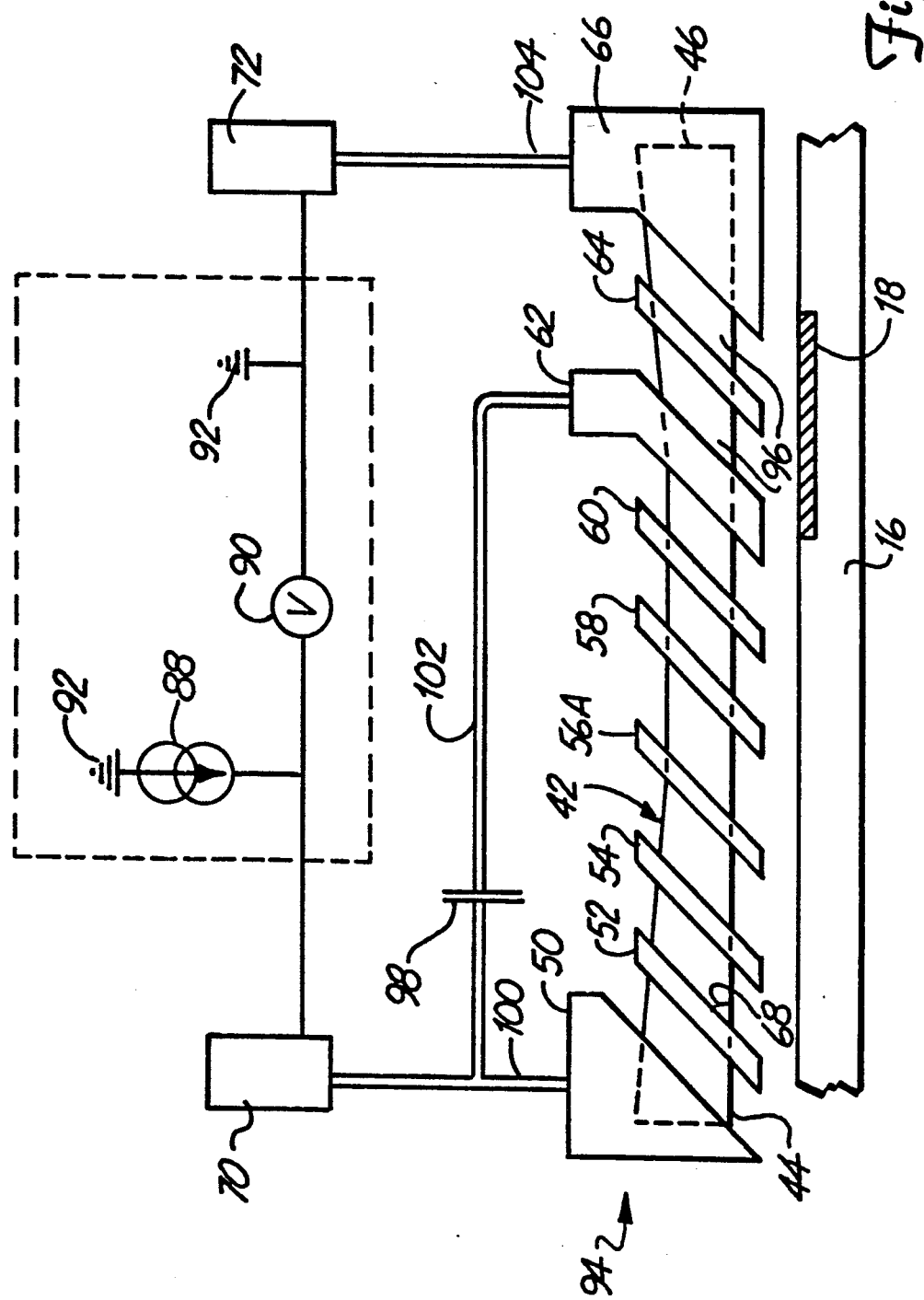
FIG. 6 shows a second embodiment of a magnetoresistive head made in accordance with the present invention.

FIG. 6 shows another embodiment of a magnetoresistive sensor 94 made in accordance with the present invention. In FIG. 6, an active region 96 of magnetoresistive element 42 is positioned over data track 18 of magnetic disk surface 16. A blocking capacitor 98 is connected between strip 50 and strip 62. Blocking capacitor 98 connects to strip 50 through conductor 100 and to strip 62 through conductor 102. Element 66 connects to terminal 72 through electrical conductor 104.

In magnetoresistive sensor 94 of FIG. 6, the active region 96 has been moved toward edge 46 of magnetoresistive element 42. Using this configuration, a single blocking capacitor 98 can be used. Current source 88 drives a sense current through the entire length of magnetoresistive element 42, between strip 50 and strip 66. Blocking capacitor 98 electrically shorts any AC signals which develop between strip 50 and strip 62. However, blocking capacitor 98 allows any AC signal developed between strip 62 and strip 66 to pass to terminal 70. Voltage sensor 90, connected between terminal 70 and terminal 72 detects any AC signals developed between terminal 70 and 72, which carry AC signals developed between strips 62 and 66. Blocking capacitor 98 prevents DC current from flowing along conductor 102 into strip 62.

Blocking capacitor 98 and electrical conductors 100, 102 and 104 are preferably fabricated directly upon a wafer which carries magnetoresistive sensor 94. Magnetoresistive sensor 94 shown in FIG. 6, exhibits the benefits of the barber pole and only requires two terminals.

In selecting capacitors, larger sized capacitors provide greater attenuation to the off-track AC data readback signal. The capacitors provide a one pole filter. In selecting the size of the capacitors, the frequency of the data signal must be considered. Typically, 0.1 microFarad capacitors should be sufficient.

The present invention provides a "hammerhead" magnetoresistive head which uses a barber pole element to reduce Barkhausen noise and which requires only two electrical connections to operate. In the present invention, blocking capacitors are used to develop two different signal paths, one for the DC sense current which passes through the entire length of the barber pole array, and one for the AC data signal which originates in the active region of the magnetoresistive element. The blocking capacitors are fabricated directly upon the wafer which is used to carry the magnetoresistive sensor. Because only two terminals are used in magnetoresistive heads made in accordance with the present invention, the present invention provides heads which are easier to manufacture and offer improved reliability.

Although the present invention has been described with reference to preferred embodiments, workers skilled in the art will recognize that changes may be made in form and detail without departing from the spirit and scope of the invention. For example, although "hammerhead" magnetoresistive heads which use barber pole magnetoresistive elements are used in the example, the present invention applies to any magnetoresistive head design where it would be desirable to reduce the number of terminals needed to operate the magnetoresistive head. Additionally, although capacitors have been shown, any type of filtering circuit or device may be used in accordance with the present invention.

What is claimed is:

1. A magnetoresistive sensor for detecting magnetic fields on a magnetic recording medium, the magnetoresistive sensor comprising:
   an elongated magnetoresistive strip having first and second opposite ends;
   first and second terminals electrically coupled to the first and second opposite ends, respectively, of the elongated magnetoresistive strip;
   a plurality of electrically conductive equipotential strips applied to the magnetoresistive strip and spaced between the first and second ends, wherein the equipotential strips generate a magnetic bias field in the magnetoresistive strip which stabilizes a magnetic domain structure of the magnetoresistive strip when a bias current is applied to the equipotential strips;
   a first capacitor connected between a first one of the plurality of equipotential strips and the first terminal; and
   a second capacitor connected between a second one of the plurality of equipotential strips and the second terminal, the second one of the plurality of equipotential strips being further spaced from the first end of the elongated magnetoresistive strip than the fist one of the plurality of equipotential strips;
   wherein the first and second ones of the plurality of equipotential strips define an active region of the elongated magnetoresistive strip.

2. A magnetoresistive read element comprising:
   an elongated strip of magnetoresistive material;
   first and second end terminals applied to opposite ends of the elongated strip for connection to a biasing current source;
   a plurality of substantially parallel conductive strips applied to the surface of the elongated strip intermediate the end terminals, the strips carrying an electrical current upon connection of the terminals to the biasing current source to generate a magnetic bias field which stabilizes a magnetic domain structure of the elongated magnetoresistive strip;
   a sensing portion of the read element intermediate a first conductive strip and a second conductive strip;
   a first capacitor coupling the first end terminal to the first conductive strip; and
   a second capacitor coupling the second end terminal to the second conductive strip.

3. A magnetoresistive sensor comprising:
   an elongated magnetoresistive element having an active region for sensing information stored upon a magnetic storage medium and having a wing region adjacent the active region;
   first and second terminals electrically coupled to opposite ends of the elongated magnetoresistive element, wherein the first and second terminals are adapted for providing a sense current through the elongated magnetoresistive strip; and
   means connected to the elongated magnetoresistive element for electrically short circuiting across the wing region between the active region and the first terminal AC signals generated by the wing region, whereby the active region of the elongated magnetoresistive element modulates a voltage created by the sense current in response to sensed information, thereby creating an AC information signal which appears at the first and second end terminals.

4. The magnetoresistive sensor of claim 3 wherein the elongated magnetoresistive element includes a second wing region and the active region is between the wing region and the second wing region, the second wing region positioned between the active region and the second terminal.

5. The magnetoresistive sensor of claim 4 and further including a second means connected to the magnetoresistive element for electrically short circuiting across the second wing region between the active region and the second terminal AC signals generated by the second wing region.

6. The magnetoresistive sensor of claim 3 wherein the means for electrically short circuiting AC signals comprises:
   an electrical element electrically connected to an edge of the active region
   and the first terminal which permits AC current to pass and blocks DC current.

7. The magnetoresistive sensor of claim 6 wherein the electrical element comprises a capacitor connected across the wing region between the active region and the first terminal.

8. The magnetoresistive sensor of claim 3 including a plurality of generally equipotential strips placed along the elongated magnetoresistive element, wherein the equipotential strips generate a magnetic bias field in the magnetoresistive element which stabilizes a magnetic domain structure of the magnetoresistive element when the sense current is applied to the equipotential strips.

9. A magnetoresistive sensor comprising:
an elongated magnetoresistive element having an active region and a wing region, the active region for sensing information stored upon a magnetic storage medium;
first and second terminals electrically coupled to opposite ends of the elongated magnetoresistive element;
a conductive strip applied to the elongated magnetoresistive element and positioned between the active region and the wing region, wherein a DC sense current path is provided between the first terminal and the conductive strip through the wing region; and
means connected between the first terminal and the conductive strip for defining an AC signal path from the first terminal to the conductive strip which electrically short circuits AC signals across the wing region between the active region and the first terminal.

10. The magnetoresistive sensor of claim 9 wherein the means for defining an AC signal path comprises a capacitor connected between the first terminal and the conductive strip wherein the capacitor conducts an AC signal and blocks a DC signal.

11. The magnetoresistive sensor of claim 9 including a plurality of generally equipotential strips placed along the elongated magnetoresistive element, wherein the equipotential strips generate a magnetic bias field in the magnetoresistive element which stabilizes a magnetic domain structure of the magnetoresistive element when a bias current is applied to the equipotential strips.

12. An apparatus for receiving a magnetically encoded signal comprising:
an elongated magnetoresistive element having a length and including an active region and a wing region adjacent the active region, the active region for sensing information stored by a magnetic storage medium;
first and second terminals electrically coupled to opposite ends of the elongated magnetoresistive element;
means connected to the first and second terminals for supplying a substantial DC sense current through the length of the elongated magnetoresistive element;
means connected to the magnetoresistive element for defining an AC signal path through the active region of the magnetoresistive element and for defining a DC sense current path through the wing region and the active region of the magnetoresistive element, whereby the active region modulates a voltage created by the DC sense current in response to sensed information, thereby creating an AC information signal which appears at the first and second terminals; and
means connected to the first and second terminals for sensing the AC information signal.

13. The apparatus of claim 12 including a conductive strip applied to the elongated magnetoresistive element and positioned between the active region and the wing region, wherein a DC sense current path is provided between the first terminal through the wing region to the conductive strip and the means for defining blocks the DC sense current and conducts the AC signal.

14. The apparatus of claim 13 wherein the means for defining comprises a capacitor connected between the first terminal and the conductive strip.

15. The apparatus of claim 12 wherein the means for sensing the AC signal comprises a voltage sensor.

16. The apparatus of claim 12 including a plurality of generally equipotential strips placed along the elongated magnetoresistive element, wherein the equipotential strips generate a magnetic bias field in the magnetoresistive element which stabilizes a magnetic domain structure of the magnetoresistive element when the DC sense current is applied to the equipotential strips.

17. In a magnetic storage system, a magnetoresistive head for sensing magnetically encoded information carried on a surface of a magnetic disk, comprising:
an elongated magnetoresistive element having a length and including an active region and a wing region, the active region for sensing the magnetically encoded information and adapted for passing over the surface of the magnetic disk, wherein the wing region is positioned adjacent the active region;
first and second terminals applied to opposite ends of the elongated magnetoresistive element;
means connected to the first and second terminals for supplying a substantial DC sense current through the length of the elongated magnetoresistive element;
means connected to the magnetoresistive element for defining a DC sense current path through the wing region and the active region and for defining an AC signal path through the active region of the magnetoresistive element, wherein the active region modulates an AC signal which appears at the first and second terminals based upon presence of the magnetically coded information; and
means connected to the first and second terminals for sensing the AC signal generated in the active region.

18. The magnetoresistive head of claim 17 including a conductive strip applied to the elongated magnetoresistive element and positioned between the active region and the wing region.

19. The magnetoresistive head of claim 18 wherein the means for defining comprises a capacitor electrically coupled between the first terminal and the conductive strip, wherein the capacitor blocks the DC sense current and conducts the AC signal.

20. The magnetoresistive head of claim 17 wherein the means for sensing an AC signal comprises a voltage sensor.

21. The magnetoresistive head of claim 17 including a plurality of generally equipotential strips placed along the elongated magnetoresistive element, wherein the equipotential strips generate a magnetic bias field in the magnetoresistive element which stabilizes a magnetic domain structure of the magnetoresistive element when the DC sense current is applied to the equipotential strips.

* * * * *

UNITED STATES PATENT AND TRADEMARK OFFICE
CERTIFICATE OF CORRECTION

PATENT NO. : 5,065,094

DATED : November 12, 1991

INVENTOR(S) : Gregory S. Mowry

It is certified that error appears in the above-identified patent and that said Letters Patent is hereby corrected as shown below:

Col. 5, line 64, delete "fist" and insert --first--.

Signed and Sealed this

Second Day of March, 1993

Attest:

STEPHEN G. KUNIN

Attesting Officer

Acting Commissioner of Patents and Trademarks